(12) United States Patent
Han et al.

(10) Patent No.: US 12,721,177 B2
(45) Date of Patent: Aug. 25, 2026

(54) VERTICAL MEMORY DEVICES

(71) Applicant: Yangtze Memory Technologies Co., Ltd., Wuhan (CN)

(72) Inventors: Yuhui Han, Wuhan (CN); Zhiliang Xia, Wuhan (CN); Wenxi Zhou, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 199 days.

(21) Appl. No.: 18/594,895

(22) Filed: Mar. 4, 2024

(65) Prior Publication Data

US 2024/0203908 A1 Jun. 20, 2024

Related U.S. Application Data

(60) Division of application No. 17/113,442, filed on Dec. 7, 2020, now Pat. No. 11,948,894, and a continuation (Continued)

(51) Int. Cl.

*H10W 42/00* (2026.01)
*H10B 41/10* (2023.01)

(Continued)

(52) U.S. Cl.

CPC .......... *H10W 42/121* (2026.01); *H10B 41/10* (2023.02); *H10B 41/27* (2023.02); *H10B 43/10* (2023.02); *H10B 43/27* (2023.02)

(58) Field of Classification Search

CPC ........ H10B 43/10; H10B 43/27; H10B 43/50; H10B 41/27; H10B 41/35; H10B 41/41

See application file for complete search history.

(56) References Cited

U.S. PATENT DOCUMENTS 10,008,570 B2 6/2018 Yu et al.
2007/0252201 A1* 11/2007 Kito ...................... H10B 43/27 257/E21.679

(Continued)

FOREIGN PATENT DOCUMENTS

CN 108377660 A 8/2018
KR 10-2018-0042358 A 4/2018

(Continued)

OTHER PUBLICATIONS

Korean Office Action issued on Jul. 8, 2022 in Korean Patent Application No. 10-2021-7025037, 11 pages.

(Continued)

*Primary Examiner* — Mohsen Ahmadi
(74) *Attorney, Agent, or Firm* — Oblon, McClelland, Maier & Neustadt, L.L.P.

(57) ABSTRACT

A semiconductor device includes a first stack of layers stacked on a substrate. The first stack of layers includes a source connection layer that is formed by replacing source sacrificial layers. The semiconductor device includes a channel structure that extends in the first stack of layers. The channel structure includes a channel layer that is in contact with the source connection layer in the first stack of layers. Further, the semiconductor device includes a shield structure formed in the first stack of layers. The shied structure encloses a stack of layers without the source connection layer.

9 Claims, 7 Drawing Sheets

Related U.S. Application Data of application No. PCT/CN2020/074059, filed on Jan. 28, 2020.

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(56) References Cited

U.S. PATENT DOCUMENTS

| | | | | |
|---|---|---|---|---|
| 2011/0121403 | A1* | 5/2011 | Lee | H10D 30/681 257/E27.06 |
| 2012/0119283 | A1* | 5/2012 | Lee | H10B 41/10 257/314 |
| 2016/0268301 | A1* | 9/2016 | Lee | H10B 43/40 |
| 2017/0025421 | A1 | 1/2017 | Sakakibara et al. | |
| 2017/0117222 | A1* | 4/2017 | Kim | H10W 20/089 |
| 2017/0176859 | A1* | 6/2017 | Kim | G03F 7/039 |
| 2017/0179025 | A1* | 6/2017 | Yun | H10B 43/10 |
| 2017/0179026 | A1 | 6/2017 | Toyama et al. | |
| 2017/0179151 | A1 | 6/2017 | Kai et al. | |
| 2017/0179152 | A1 | 6/2017 | Toyama et al. | |
| 2017/0179153 | A1 | 6/2017 | Ogawa et al. | |
| 2017/0179154 | A1 | 6/2017 | Furihata et al. | |
| 2018/0122904 | A1 | 5/2018 | Matsumoto et al. | |
| 2018/0122905 | A1 | 5/2018 | Ogawa et al. | |
| 2018/0261671 | A1 | 9/2018 | Matsumoto et al. | |
| 2019/0221557 | A1 | 7/2019 | Kim et al. | |
| 2019/0295956 | A1 | 9/2019 | Kawai et al. | |
| 2019/0312051 | A1 | 10/2019 | Park et al. | |
| 2019/0348436 | A1* | 11/2019 | Kim | H10B 43/27 |
| 2019/0355740 | A1 | 11/2019 | Hong et al. | |
| 2020/0027835 | A1 | 1/2020 | Hsu et al. | |
| 2020/0058670 | A1* | 2/2020 | Oh | H10B 43/50 |
| 2020/0119031 | A1* | 4/2020 | Shen | H10B 41/35 |
| 2020/0287007 | A1 | 9/2020 | Kasai | |
| 2021/0159167 | A1 | 5/2021 | Tsutsumi et al. | |

FOREIGN PATENT DOCUMENTS

| | | | |
|---|---|---|---|
| KR | 10-2019-0132742 | A | 11/2019 |
| TW | 201939721 | A | 10/2019 |

OTHER PUBLICATIONS

Supplementary European Search Report dated Jul. 13, 2022 European Application No. 20 91 3057, 8 pages.

Japanese Office Action issued on Oct. 17, 2022 in Japanese Patent Application No. 2021-546332, 9 pages.

European Communication issued on Sep. 12, 2023 in the corresponding European Application No. 20913057.4, 6 pages.

* cited by examiner

VERTICAL MEMORY DEVICES

CROSS-REFERENCE TO RELATED APPLICATIONS

This application is a divisional of U.S. application Ser. No. 17/113,442, filed on Dec. 7, 2020, which is a bypass continuation of International Application No. PCT/CN2020/074059, filed on Jan. 28, 2020. The entire disclosure of the prior application is hereby incorporated by reference in its entirety.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes a first stack of layers stacked on a substrate. The first stack of layers includes a source connection layer. The source connection layer is formed by replacing source sacrificial layers. The semiconductor device includes a channel structure that extends in the first stack of layers. The channel structure includes a channel layer, such as a semiconductor layer, that is in contact with the source connection layer in the first stack of layers. Further, the semiconductor device includes a shield structure formed in the first stack of layers. The shied structure encloses a stack of layers without the source connection layer.

In some embodiments, the shield structure is formed in a staircase region. The region enclosed by the shield structure may include one or more dummy channel structures. In some examples, the shield structure is disposed between two neighboring gate line cut structures. In some embodiments, the shield structure includes a non-enclosed portion. In an embodiment, the non-enclosed portion is disposed in a core region with channel structures.

In an embodiment, the shield structure is formed of a material with an etch rate selectivity to the source sacrificial layers being larger than a threshold. In another embodiment, a width of the shield structure is larger than a threshold width.

In some examples, the first stack of layers includes one or more gate layers for select transistors.

Aspects of the disclosure provide a method for fabricating a semiconductor device. The method includes stacking first layers including one or more source sacrificial layers on a substrate along a first direction perpendicular to a main surface of the substrate. Then, the method includes forming a shield structure that encloses a portion of the source sacrificial layers. Further, the method includes forming channel structures that extend in the first direction into the first layers. The channel structure includes a channel layer surrounded by one or more insulating layers. Then, the method includes forming a gate line cut trench down to a sacrificial layer in the first layers, and replacing, via the gate line cut trench, the source sacrificial layers with at least a source connection layer. The portion of the source sacrificial layers enclosed by the shield structure remains on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
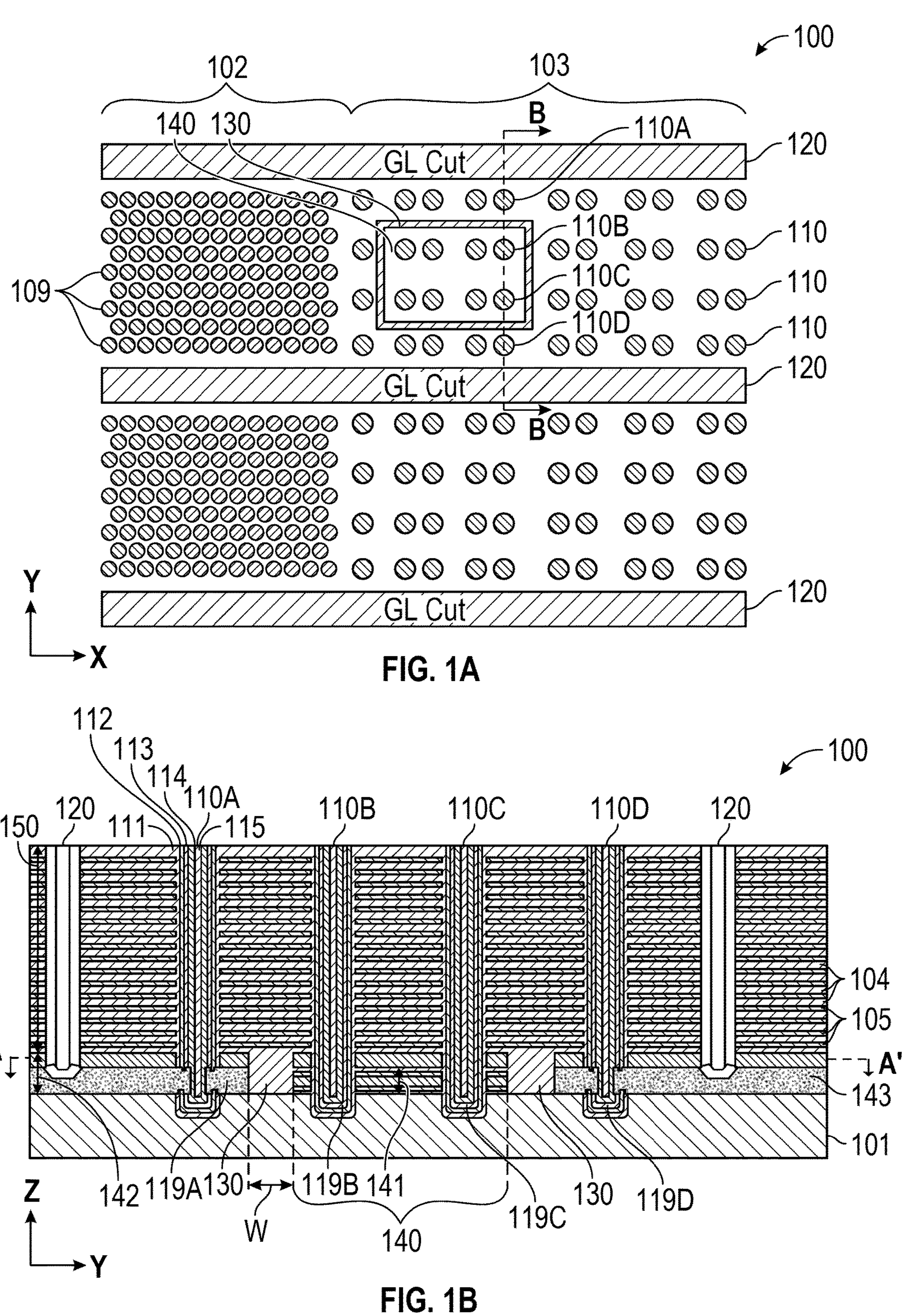
FIGS. 1A and 1B show a horizontal cross-sectional view and a vertical cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various fabrication technologies, such as sidewall selective epitaxial growth (SEG), and the like are developed to fabricate vertical memory devices. The sidewall SEG technology is also referred to as SWS technology. The SWS technology is used during a fabrication of a semiconductor device, to replace source sacrificial layers underneath a stack of layers for forming vertical memory cell strings with an epitaxial layer that can be used to form source connections for the vertical memory cell strings. During the replacement process, after the source sacrificial layers are removed, and before the epitaxial layer is fully formed, the stack of layers may have a risk of collapse.

The present disclosure provides techniques to reduce the risk of collapse. Specifically, a shield structure can be formed to enclose a portion of the source sacrificial layers to protect the portion of the source sacrificial layers from being removed, thus the portion of the source sacrificial layers remains in place to support the stack of layers for forming the vertical memory devices.

In some embodiments, shield structures are formed after a first stack of initial layers are stacked on the substrate of the semiconductor device. The first stack of initial layers includes the source sacrificial layers. The shield structures are formed in the first stack of initial layers to enclose a portion of the sacrificial layers. Then, a second stack of initial layers are stacked on the first stack of initial layers. The second stack of initial layers includes gate sacrificial layers.

After the formation of vertical channel structures that extend through the second stack of initial layers and the first stack of initial layers, trenches are formed down to a source sacrificial layer in the first stack of initial layers. The trenches are referred to as gate line (GL) cut trenches, or gate line slits in some examples. Via the GL cut trenches, the source sacrificial layers can be removed to form source connection openings, and expose the sidewalls of the bottom portions of the vertical channel structures. The exposed sidewalls of the bottom portions of the vertical channel structures correspond to the sources of strings of the vertical memory cells. Then, SEG can be performed to fill the source connection openings with source connection layers and form the source connections with the channels of the vertical memory cells. When the source sacrificial layers are replaced by the source connection layers, the first stack of initial layers becomes a first stack of layers for the semiconductor device.

It is noted that, via the GL cut trenches, the gate sacrificial layers can be replaced with gate layers. When the gate sacrificial layers are replaced by the gate layers, the second stack of initial layers become second stack of layers for the semiconductor device.

When the source sacrificial layers are removed, the channel structures of the memory cells can support core regions from collapse. Generally, dummy channel structures can be formed in staircase regions at the same time when the channel structures are formed in the core regions. However, the dummy channel structures in the staircase region have much less density than the channel structures in the core region, and thus the staircase regions may be vulnerable when the source sacrificial layers are removed and have risk of collapse.

According to some aspects of the disclosure, the shield structures can be formed in the staircase regions. The shield structures can protect portions of source sacrificial layers in the staircase region from being completely removed during the removal of the source sacrificial layers. The remaining portions of the source sacrificial layers can keep the staircase regions stable and reduce the risk of collapse.

FIG. 1A shows a horizontal cross-sectional view and FIG. 1B shows a vertical cross-sectional view of a semiconductor device 100 in accordance with some embodiments of the disclosure. The semiconductor device 100 includes a substrate 101 (e.g., wafer substrate), and circuits formed on the thereupon. A main surface of the substrate 101 (e.g., surface of a wafer) extends for example in the X direction and the Y direction. The horizontal cross-section (e.g., X-Y plane) is parallel to the main surface of the substrate 101, and the vertical cross-section (e.g., X-Z plane, Y-Z plane) is perpendicular to the main surface of the substrate 101. FIG. 1A shows a line B-B' for generating the vertical cross-sectional view in FIG. 1B; and FIG. 1B shows a line A-A' for generating the horizontal cross-sectional view in FIG. 1A.

For simplicity, some components are omitted from the cross-sectional views.

The semiconductor device 100 refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. The substrate 101 can be any suitable substrate, such as a silicon (Si) substrate, a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer.

In various embodiments, the semiconductor device 100 includes three dimensional (3D) NAND memory circuitry formed on the substrate 101. The semiconductor device 100 can include other suitable circuitry (not shown), such as logic circuitry, power circuitry, and the like that is formed on the substrate 101, or other suitable substrate, and is suitably coupled with the 3D NAND memory circuitry. Generally, the 3D NAND memory circuitry includes a memory array and peripheral circuitry (e.g., address decoder, driving circuits, sense amplifier and the like). The memory array is formed in a core region 102 as an array of vertical memory cell strings. The peripheral circuitry is formed in a peripheral region (not shown). Besides the core region 102 and the peripheral region, the semiconductor device 100 includes a staircase region 103 to facilitate making contacts to the gates of the memory cells in the vertical memory cell strings. The gates of the memory cells in the vertical memory cell strings are connected with word lines for the NAND memory architecture.

According to some aspects of the disclosure, shield structures 130 are formed in a first stack of layers 142 to enclose portions of source sacrificial layers 141, and vertical memory cell strings are formed in a second stack of layers 150 that is stacked on the first stack of layers 142. The second stack of layers 150 includes gate layers 105 and insulating layers 104 that are stacked alternatingly. The gate layers 105 and the insulating layers 104 are configured to form transistors that are stacked vertically. In some examples, the stack of transistors includes memory cells and select transistors, such as a bottom select transistor, a top select transistor and the like. In some examples, the stack of transistors can include one or more dummy bottom select transistors. The gate layers 105 correspond to gates of the transistors. The gate layers 105 are made of a gate stack materials, such as high dielectric constant (high-k) gate insulator layers, metal gate (MG) electrode, and the like. The insulating layers 104 are made of insulating material(s), such as silicon nitride, silicon dioxide, and the like.

According to some aspects of the disclosure, channel structures 109 are formed in the core region 102 and the dummy channel structures 110 are formed in the staircase region 103. In some embodiments, each of the channel structures 109 has a pillar shape that extends in the Z direction that is perpendicular to the direction of the main surface of the substrate 101. The plurality of channel structures 109 can be disposed separate from each other along the X direction and the Y direction, and can be disposed in some suitable array shape, such as a matrix array shape along the X direction and the Y direction, a zig-zag array shape along the X or Y direction, a beehive (e.g., hexagonal) array shape, and the like. In some embodiments, each of the channel structures 109 has a circular shape in the X-Y plane, and a pillar shape in the X-Z plane and Y-Z plane. In some embodiments, the quantity and arrangement of the channel structures 109 between two GL cut 120 is not limited.

The dummy channel structures 110 have similar structures as the channel structures 109. In some embodiment, the dummy channel structures 110 have the same structure and array with the channel structures 109. However, in this application, it is noted that the staircase region 103 is configured to form contacts to the gates of the memory cells, and the contacts cannot overlap with the dummy channel structures, thus the density of the dummy channel structures 110 is much lower than the density of the channel structures 109.

In an embodiment, each of the channel structure 109 and dummy channel structures 110 is formed by materials in the circular shape in the X-Y plane, and extends in the Z direction. For example, each of dummy channel structures 110 and the channel structures 109 includes function layers, such as a blocking insulating layer 111 (e.g., silicon oxide), a charge storage layer (e.g., silicon nitride) 112, a tunneling insulating layer 113 (e.g., silicon oxide), a semiconductor layer 114, and an insulating layer 115 that have the circular shape in the X-Y plane, and extend in the Z direction. In an example, the blocking insulating layer 111 (e.g., silicon oxide) is formed on the sidewall of holes for the dummy channel structures 110 and the channel structures 109, and then the charge storage layer (e.g., silicon nitride) 112, the tunneling insulating layer 113, the semiconductor layer 114, and the insulating layer 115 are sequentially stacked from the sidewall. The semiconductor layer 114 can be any suitable semiconductor material, such as polysilicon or monocrystalline silicon, and the semiconductor material may be un-doped or may include a p-type or n-type dopant. The insulating layer 115 is formed of an insulating material, such as silicon oxide and/or silicon nitride, and/or may be formed as an air gap.

According to some aspects of the disclosure, some of the dummy channel structures 110 are disposed in the regions that are enclosed in the shield structures 130, and have different end structures from other dummy channel structures and the channel structures 109.

In the FIG. 1A and FIG. 1B example, a shield structure 130 encloses a region 140, the dummy channel structures 110B and 110C are within the region 140 that is enclosed by the shield structure 130, and the dummy channel structures 110A and 110D are outside of the region 140 that is protected by the shield structure 130 during a replacement of the source sacrificial layers 141 with source connection layers 143. Thus, the source sacrificial layers 141 inside the region 140 remains in place, and the source sacrificial layers 141 outside the region 140 have been replaced by the source connection layers 143. The removal of the source sacrificial layers 141 also exposes the semiconductor layer 114 at the end of the channel structures and dummy channel structures that are not enclosed in the region 140. As shown in FIG. 1B, the end structure 119B of the dummy channel structure 110B and the end structure 119C of the dummy channel structure 110C are different from the end structure 119A of the dummy channel structure 110A and the end structure 119D of the dummy channel structure 110D. It is noted that, in some examples, the channel structures 110 have similar end structures as the end structures 119A and 119D.

Specifically, using the end structure 119B as an example, because the dummy channel structure 110B is within the region 140 that is protected by the shield structure 130, the end structure 119B has the same structures, such as same layers of materials, as the other portion of the dummy channel structure 110B. For example, the end structure 119B includes the blocking insulating layer 111, the charge storage layer 112, the tunneling insulating layer 113, the semiconductor layer 114, and the insulating layer 115 that are extended, along the Z direction, of the entire dummy channel structure 110B. Without the protection of the shield structure 130, for example, some of the channel structure layers, such as the blocking insulating layer 111, the charge storage layer 112, the tunneling insulating layer 113 and the like at the ends of the channel structures 109 and the dummy channel structures 110A and 110D are removed during the removal of the source sacrificial layers 141, such as shown by the end structures 119A and 119D in the FIG. 1B. When the source connection layers 143 fill into the opened space of the removed source sacrificial layers, connections of the semiconductor layer 114 of the channel structures 109 and the source connection layers 143 can be formed, such as shown by the end structures 119A and 119D in FIG. 1B.

The shield structures 130 are suitably configured (e.g., suitable material and suitable width in the X-Y plane) such that when the source sacrificial layers are removed, the shield structures 130 are not completely etched away, and then can protect a portion of the source sacrificial layers (shown as the region 140) that are surrounded by the shield structures 130. In some examples, the shield structures 130 are suitable formed of a material that has significant etch rate selectivity (e.g., larger than a threshold) to materials of the source sacrificial layers. In an example, the source sacrificial layers include a polysilicon layer sandwiched by two layers of silicon nitride and then sandwiched by two layers of silicon oxide. In another example, the width (W) of the shield structures 130 is designed to be wide enough (e.g., larger than a threshold width), such that the removal of the source sacrificial layers does not completely etch away the shield structures 130.

In an embodiment, a shield structure 130 is formed of a single layer, such as an oxide layer. In another embodiment, a shield structure 130 is formed by multiple layers. In an example, a shield structure 130 is formed of an oxide layer and a polysilicon layer. In another example, a shield structure 130 is formed of an aluminum oxide (AI203) layer and an oxide layer. In another example, a shield structure 130 is formed of a silicon nitride layer and an oxide layer. In another example, the shield structure 130 is formed of multiple silicon nitride layers and oxide layers that are stacked alternatively.

While the cross-sections of the shield structures 130 are shown as rectangular shapes in FIG. 1B, the shield structures

Figure 1C:
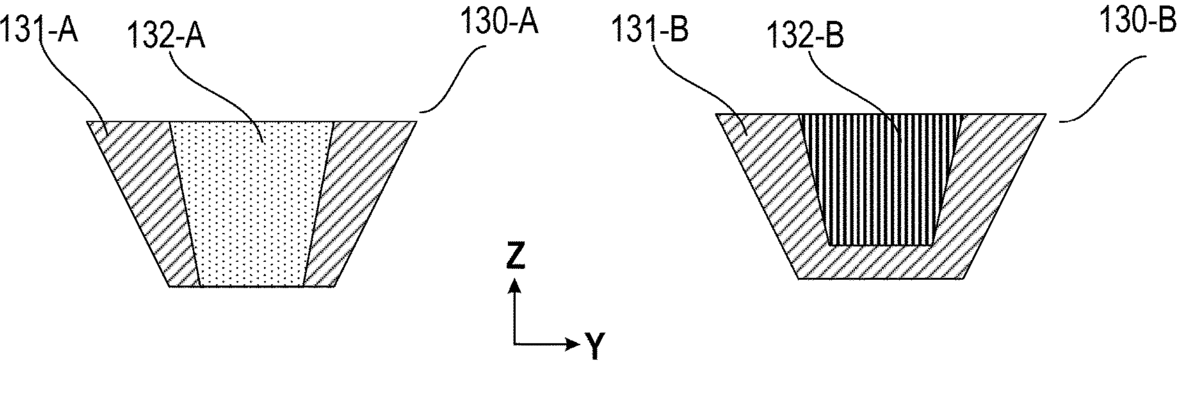
FIG. 1C shows close up views of cross-sectional views of shield structures according to some embodiments of the disclosure.

130 can have other shapes for the cross-section. FIG. 1C shows close up views of two cross-sectional views of a first shield structure 130-A and a second shield structure 130-B according to some embodiments of the disclosure. The cross-sections of the first shield structure 130-A and the second shield structure 130-B have trapezoid shapes. Further, the first shield structure 130-A and the second shield structure 130-B are formed of multiple layers.

For example, the first shield structure 130-A is formed of a sidewall liner layer 131-A and a filler layer 132-A. The sidewall liner layer 131-A covers the sidewalls of an opening for the shield structure 130-A, but does not cover the bottom of the opening. The second shield structure 130-B is formed of a liner layer 131-B and a filler layer 132-B. The liner layer 131-B covers the sidewalls and the bottom of an opening for the shield structure 130-B.

According to some aspects of the disclosure, the shield structures 130 are formed in the first stack 142 (e.g., the shield structures 130 and the first stack 142 have about the same height level in the Z direction) that is underneath the second stack 150. In the Z direction, the first stack 142 includes initially the source sacrificial layers that are replaced by source connection layers 143. In some examples, the first stack 142 includes layers (gate layers and insulating layers) for dummy bottom select transistor(s). In some examples, the first stack 142 includes layers (gate layers and insulating layers) for bottom select transistor(s). In some examples, the first stack 142 includes layers (gate layers and insulating layers) for memory cells. It is noted when the first stack 142 includes gate layers, the shield structures 130 may prevent, in the enclosed region 140, a replacement of sacrificial gate layers with the gate layers.

According to some aspects of the disclosure, shield structures can be formed in the entire stack that includes the source sacrificial layers that are replaced by source connection layers, layers (gate layers and insulating layers) for dummy bottom select transistor(s), layers (gate layers and insulating layers) for bottom select transistor(s), layers (gate layers and insulating layers) for memory cells and layers (gate layers and insulating layers) for top select transistors, and the like. Thus, the entire stack can be referred to as the first stack, and the second stack does not exist in some examples.

Figure 1D:
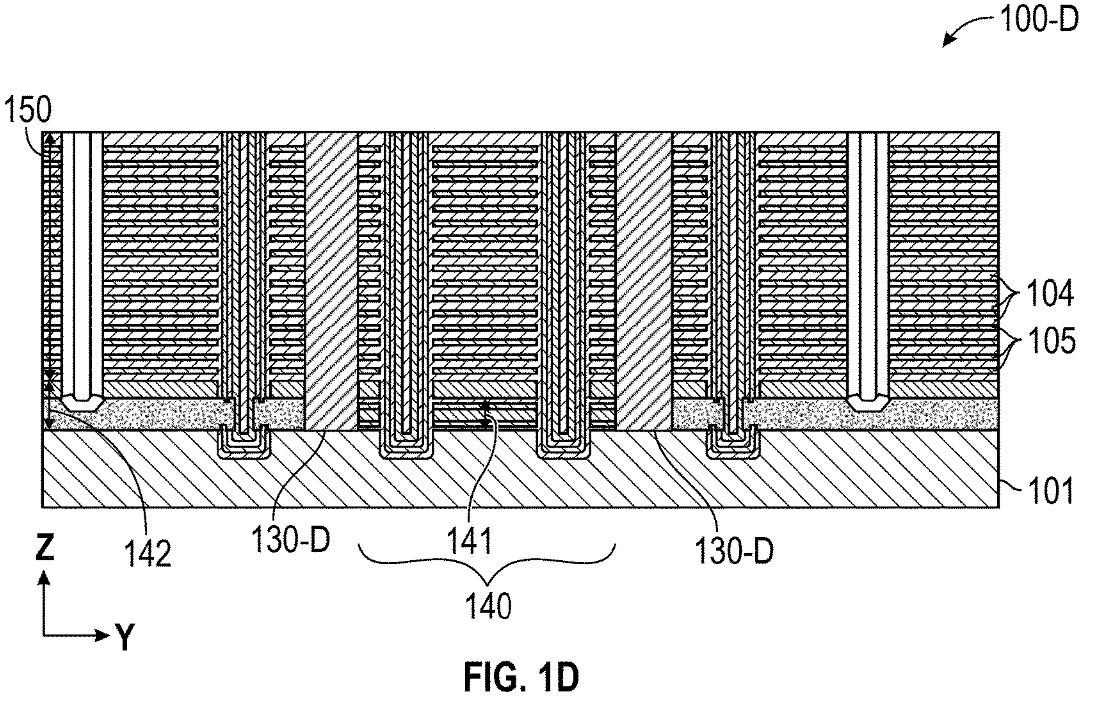
FIG. 1D shows a cross-sectional view of another semiconductor device in accordance with some embodiments.

FIG. 1D shows a cross-sectional view of a semiconductor device 100-D according to some embodiments of the disclosure. The semiconductor device 100-D includes identical or equivalent structures that are in the semiconductor device 100; the description of these structures has been provided above and will be omitted here for clarity purposes. In the FIG. 1D example, the semiconductor device 100-D includes shield structures 130-D that are formed in the entire stack that includes the source sacrificial layers that are replaced by source connection layers, layers (gate layers and insulating layers) for dummy bottom select transistor(s), layers (gate layers and insulating layers) for bottom select transistor(s), layers (gate layers and insulating layers) for memory cells and layers (gate layers and insulating layers) for top select transistors, and the like.

In some embodiments, in the X-Y plane, the shield structures 130 are defined according to patterns in a mask. Generally, a shield structure 130 is disposed between two GL cut structures 120 and in the staircase region 103. In some embodiments, the shield structure 130 is spaced from the GL cut structures 120, and the portion between the shield structure 130 and the GL cut structures 120 includes layers (e.g., source connection layers, gate layers) that can be configured for signal paths or current paths.

In an embodiment, a shield structure 130 can have an enclosed pattern that surrounds an area to protect source sacrificial layers in the area from being etched away during a removal process for the source sacrificial layers. Thus, the shield structure 130 and the portion of the source sacrificial layers that is protected by the shield structure 130 can support neighboring regions when the source sacrificial layers of the neighboring regions are removed and reduce the risk of collapse. In another embodiment, a shield structure 130 does not have an enclosed pattern. The shield structure 130 is suitably configured (with a relatively large width), and is not completely etched away during a removal process for the source sacrificial layers. Then, the remaining portion of the shield structure 130 can support neighboring regions when the source sacrificial layers of the neighboring regions are removed and reduce the risk of collapse.

Figures 2A, 2B:
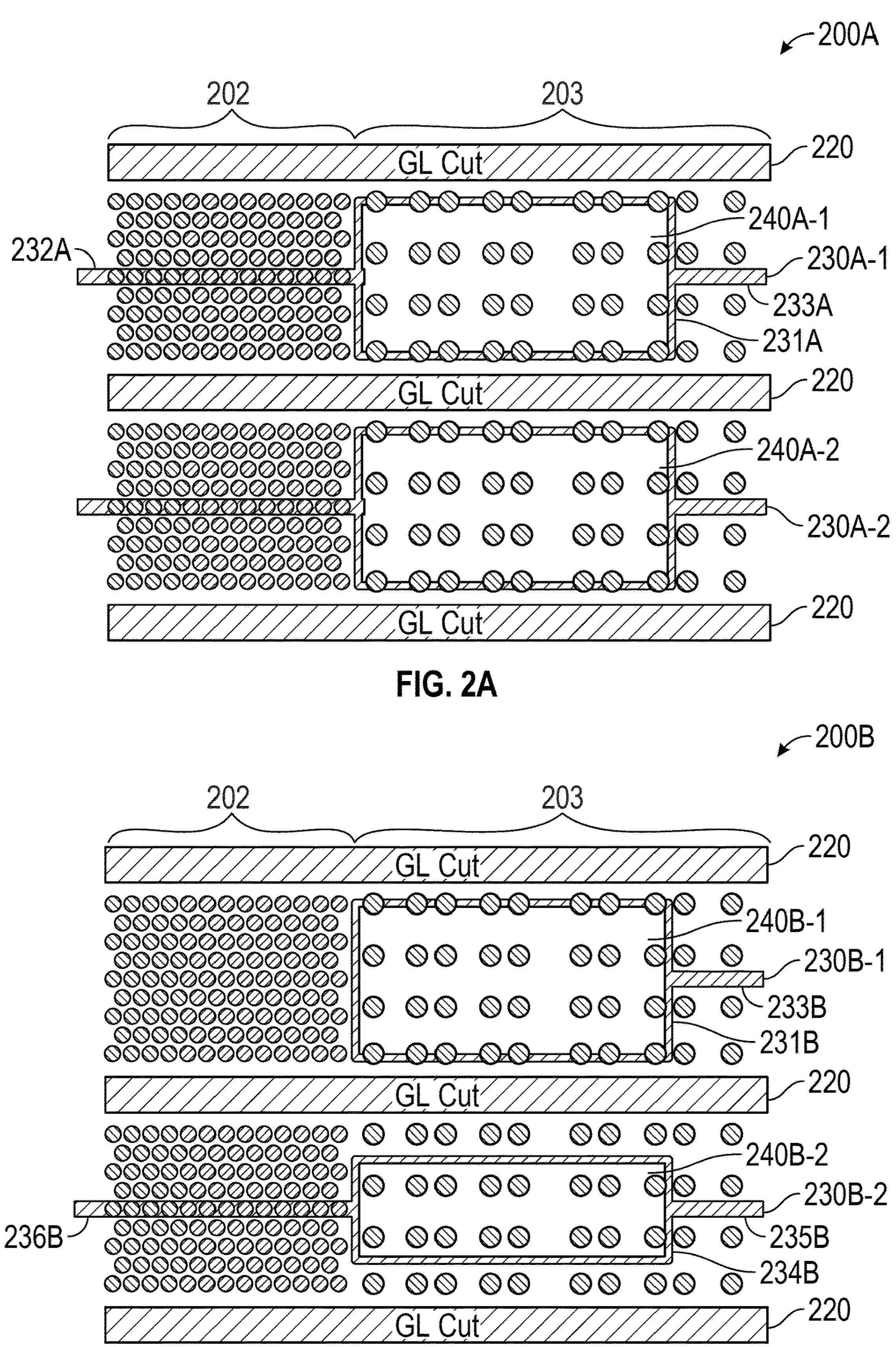
FIGS. 2A-2C show layout design examples of shield structures in accordance with some embodiments.
Figure 2C:
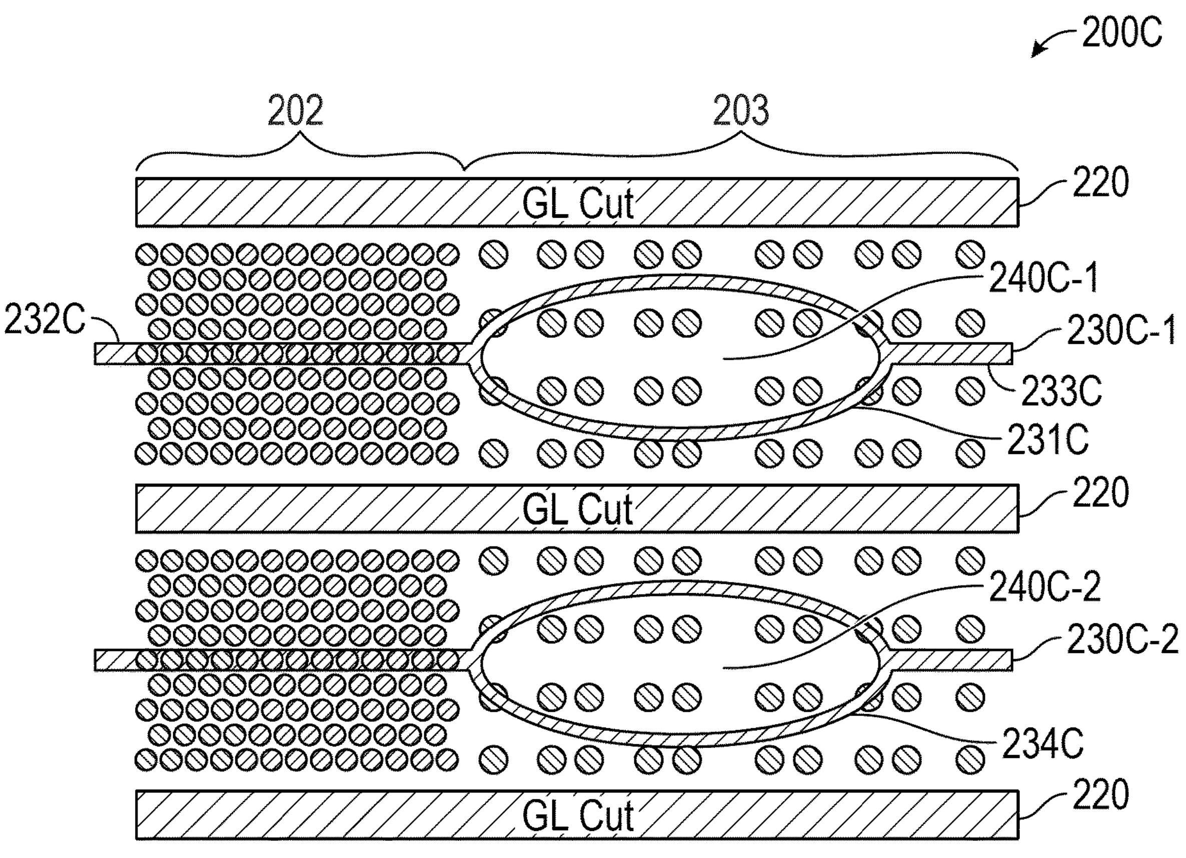

FIGS. 2A-2C show layout design examples of patterns for the shield structures 130 in accordance with some embodiments.

FIG. 2A shows a layout design 200A of shield structures, such as the shield structures 130. The layout design 200A can be used to fabricate a semiconductor device, such as the semiconductor device 100. The layout design 200A includes, a first pattern 230A-1 and a second pattern 230A-2 that are used to define shield structures. The first pattern 230A-1 and the second pattern 230A-2 are configured similarly. Using the first pattern 230A-1 as an example, the first pattern 230A-1 is disposed between patterns 220 for neighboring GL cut structures, has an enclosed portion 231A that encloses a region 240A-1, and has non-enclosed portions, such as shown by 232A and 233A. In the FIG. 2A example, the enclosed portion 231A is disposed in the staircase region 203, and the non-enclosed portion 232A is disposed in the core region 202 and non-enclosed portion 233A is disposed in the staircase region 203.

FIG. 2B shows a layout design 200B of shield structures, such as the shield structures 130. The layout design 200B can be used to fabricate a semiconductor device, such as the semiconductor device 100. The layout design 200B includes, a first pattern 230B-1 and a second pattern 230B-2 that are used to define shield structures. The first pattern 230B-1 and the second pattern 230B-2 are different. The first pattern 230B-1 is disposed between patterns 220 for neighboring GL cut structures and in the staircase region 203. The first pattern 230B-1 has an enclosed portion 231B that encloses a region 240B-1, and has a non-enclosed portion 233B. The second pattern 230B-2 is disposed between patterns 220 for neighboring GL cut structures. The second pattern 230B-2 has an enclosed portion 234B that encloses a region 240B-2 in the staircase region, and has a non-enclosed portion 236B in the core region 202 and a non-enclosed portion 235B in the staircase region 203. The enclosed regions 240B-1 and 240B-2 have different rectangular shapes.

FIG. 2C shows a layout design 200C of shield structures, such as the shield structures 130. The layout design 200C can be used for fabricating the semiconductor device 100. The layout design 200C includes, a first pattern 230C-1 and a second pattern 230C-2 that are used to define shield structures. The first pattern 230C-1 and the second pattern 230C-2 are configured similarly. Using the first pattern 230C-1 as an example, the first pattern 230C-1 is disposed between patterns 220 for neighboring GL cut structures, has an enclosed portion 231C that encloses a region 240C-1, and has non-enclosed portions 232C and 233C. In the FIG. 2C example, the enclosed portion 231C is disposed in the staircase region 203, the non-enclosed portion 232C is disposed in the core region 202 and the non-enclosed portion 233C is disposed in the staircase region 203. The enclosed area 240C-1 has an oval shape.

It is noted that the FIGS. 2A-2C are merely examples, other suitable patterns (regular patterns such as circular and/or irregular patterns) can be used to define the shield structures 130. In some examples, a shield mask is generated based on patterns of the shield structures in the layout design, and the shield mask is used during fabrication to define the shield structures in semiconductor devices.

Figure 3:
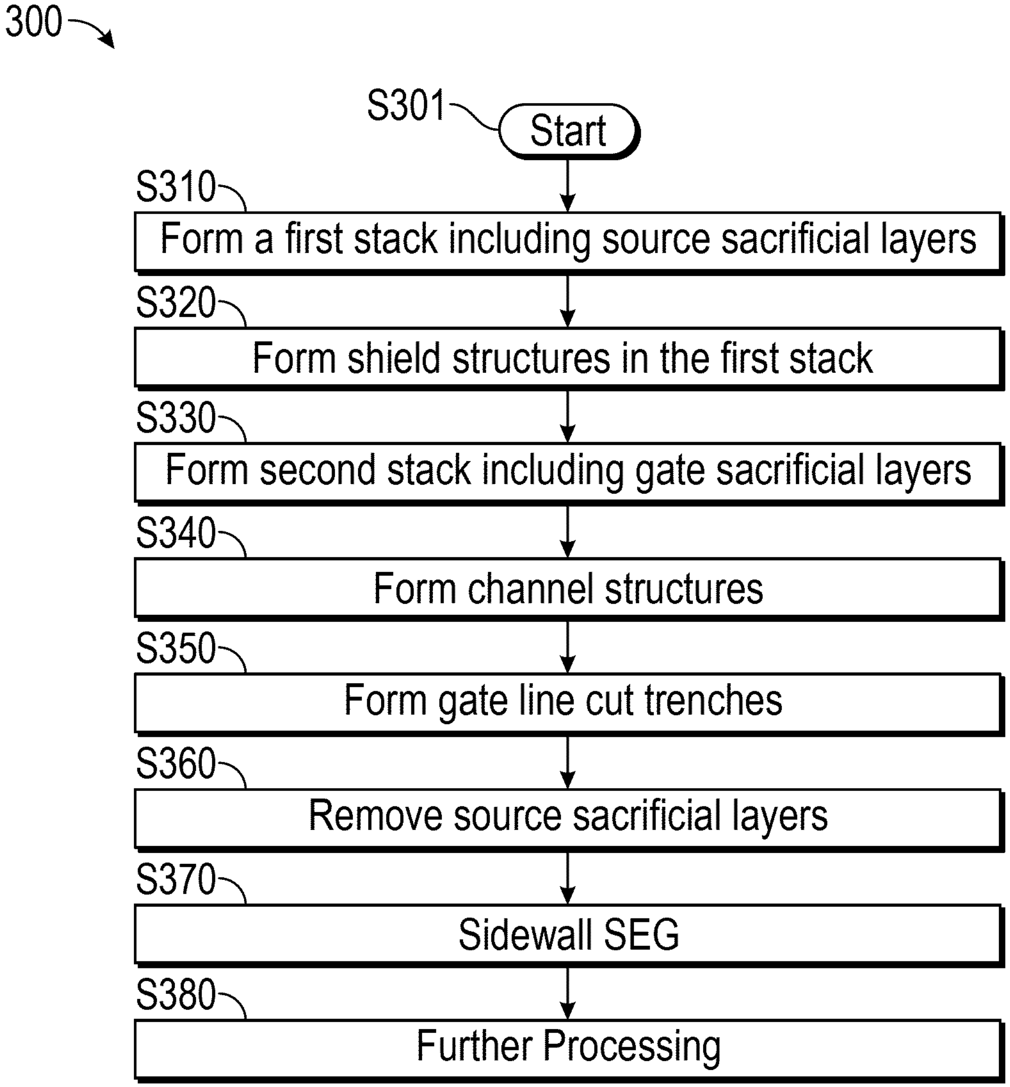
FIG. 3 shows a flow chart outlining a process example according to some embodiments of the disclosure.

FIG. 3 shows a flow chart outlining a process example for fabricating a semiconductor device, such as the semiconductor device 100 and FIGS. 4A-4H show cross-sectional views of the semiconductor device during fabrication according to some embodiments of the disclosure. For simplicity, the dummy channel structures 110A and 110D that are out of the enclosed region 140 are omitted in the cross-sectional views. The process starts at S301 and proceeds to S310.

At S310, a first stack of initial layers is formed on a substrate. The first stack of initial layers includes source sacrificial layers. In some examples, the first stack of initial layers can include sacrificial gate layers and insulating layers that are used to form transistors, such as dummy bottom select transistors, bottom select transistors, memory cell transistors, and the like. Additionally, in some examples, buffer layers can be formed on the first stack of initial layers.

Figures 4A, 4B, 4C, 4D, 4E, 4F, 4G, 4H:
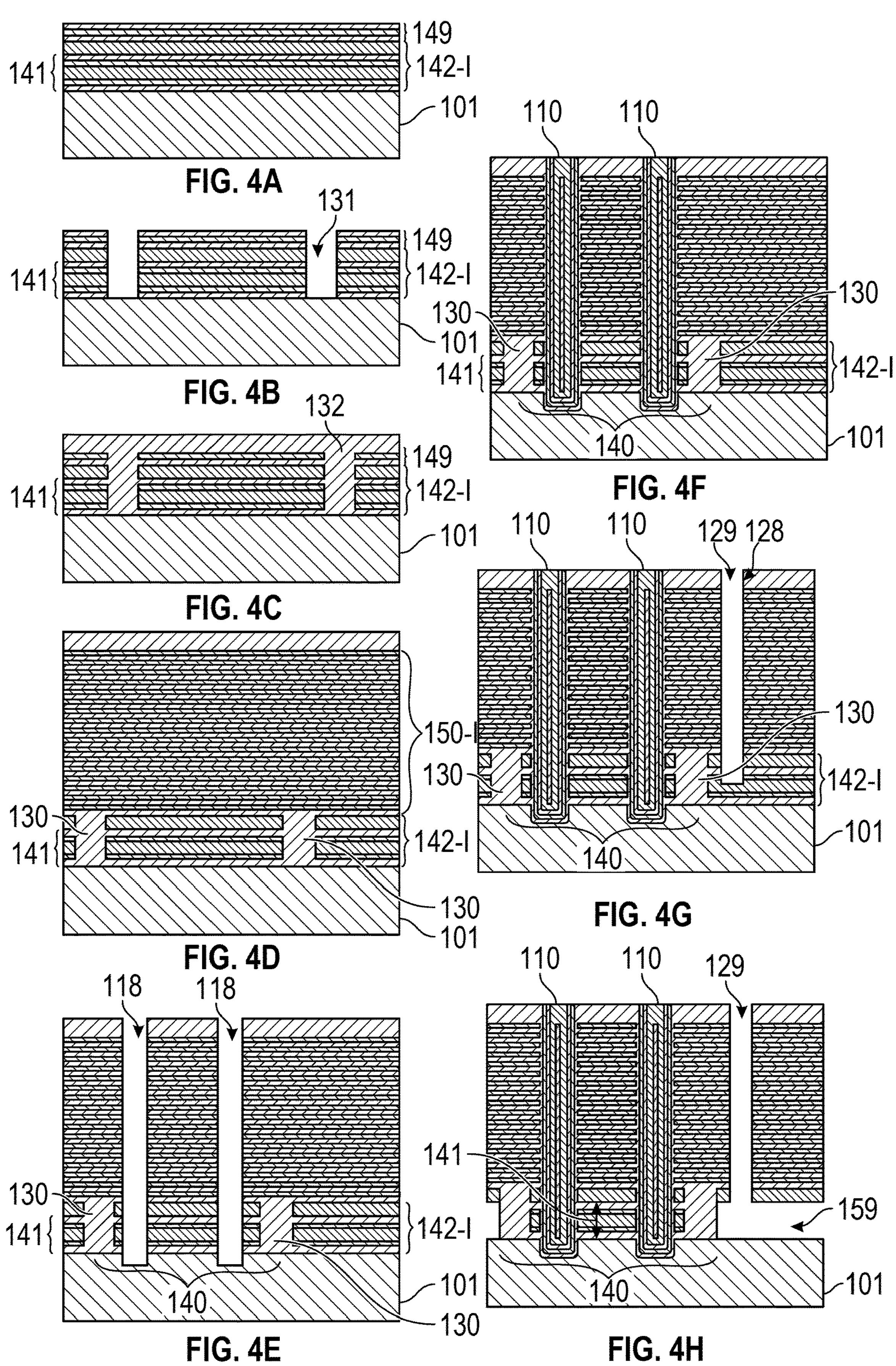
FIGS. 4A-4H show vertical cross-sectional views of the semiconductor device during a fabrication process according to some embodiments of the disclosure.

FIG. 4A shows the cross-sectional view of the semiconductor device 100 after the first stack of initial layers 142-I is formed on the substrate 101. The first stack of initial layers 142-I includes one or more source sacrificial layers 141 and/or one or more isolation layers. In other embodiments, the source sacrificial layer 141 includes only one layer. When the source sacrificial layers 141 are replaced by source connection layers, the first stack of initial layers 142-I become the first stack of layers 142. In the FIG. 4A example, buffer layers 149 are also stacked on the first stack of initial layers 142-I. The buffer layers 149 can protect the first stack during etch process or chemical mechanical polishing (CMP) process. In other embodiments, the buffer layer 149 includes only one layer, for example, an isolation layer or a sacrificial layer.

Referring back to FIG. 3, at S320, shield structures 130 are formed in the first stack of initial layers 142-I. In some examples, the shield mask is used to transfer the patterns of the shield structures into the first stack of initial layers 142-I.

In an example, a lithography process and an etch process can be used to transfer the patterns of the shield structures from the shield mask to the first stack of initial layers 142-I.

FIG. 4B shows the cross-sectional view of the semiconductor device 100 after an etch process that generates openings 131 in the first stack of initial layers 142-I. The patterns of the openings 131 correspond to the patterns for the shield structures to be formed.

Further, in an example, shield material is filled into the openings 131 to form the shield structures 130. In an example, the openings 131 are overfilled with the shield material. FIG. 4C shows the cross-sectional view of the semiconductor device 100 after the openings are overfilled with the shield material 132.

Further, a chemical mechanical polishing (CMP) process is used to remove the overburden shield material. The buffer layers 149 can prevent the first stack of initial layers 142 from damage due to the CMP process. The buffer layers 149 can be removed after the CMP process and before the formation of the second stack of initial layers.

Referring back to FIG. 3, at S330, a second stack of initial layers is stacked on the first stack of initial layers. The second stack of initial layer includes gate sacrificial layers and insulating layers that are used to form memory cell transistors. When the gate sacrificial layers are replaced by gate layers, the second stack of initial layers becomes the second stack of layers in the semiconductor device 100. FIG. 4D shows the cross-sectional view of the semiconductor device 100 after the second stack of initial layers 150-I is stacked on the first stack of initial layers 142-I.

Referring back to FIG. 3, at S340, channel structures are formed in the first stack of initial layers 142-I and the second stack of initial layers 150-I.

In some embodiments, staircase is formed in the staircase region and suitably planarization process is performed to obtain a relatively flat surface. Then, photo lithography technology is used to define patterns of channel holes and dummy channel holes in photoresist and/or hard mask layers, and etch technology is used to transfer the patterns into the second stack of initial layers 150-I and the first stack of initial layers 142-I. Thus, channel holes are formed in the core region and the dummy channel holes are formed in the staircase region.

FIG. 4E shows the cross-sectional view of the semiconductor device 100 after channel holes and dummy channel holes are formed. In the FIG. 4E example, two dummy channel holes 118 are formed in a region 140 that is enclosed by the shield structure 130.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures. In an example, the blocking insulating layer is formed on the sidewall of channel holes and the dummy channel holes. Then, a charge storage layer, a tunneling insulating layer, a semiconductor layer, and an insulating layer are sequentially stacked from the sidewall. In some embodiments, the dummy channel structures are formed by support materials.

FIG. 4F shows the cross-sectional view of the semiconductor device after the formation of the channel structures and dummy channel structures, such as the dummy channel structures 110B and 110C.

Referring back to FIG. 3, at S350, gate line cut trenches (also referred to as gate line slits in some examples) are formed. In some embodiments, the gate line cut trenches are etched to a source sacrificial layer in the first stack of initial layers 142-I. In an example, the source sacrificial layers 141 includes a silicon oxide layer, a silicon nitride layer, a polysilicon layer, a silicon nitride layer and a silicon oxide layer from bottom. The polysilicon layer is sandwiched by two silicon nitride layers and then two silicon oxide layers. Then, the etching of the gate line cut trenches stops at the polysilicon layer.

FIG. 4G shows the cross-sectional view of the semiconductor device after the formation of the gate line cut trenches 129. The etching of the gate line cut trenches stops at one of the source sacrificial layers, such as a polysilicon layer.

Referring back to FIG. 3, at S360, source sacrificial layers are removed via the gate line cut trenches. The removal of the source sacrificial layers forms source connection openings. In an example, when the polysilicon layer is sandwiched by two silicon nitride layers and then two silicon oxide layers, a first etchant is applied to remove the polysilicon layer. The silicon nitride layers can protect the other layers from damage due to the first etchant. Then, a second etchant is applied to remove the two silicon nitride layers. The silicon oxide layers can protect the other layers from damage due to the second etchant. Then, a third etchant is applied to remove the two silicon oxide layers.

FIG. 4H shows a cross-sectional view of the semiconductor device after the removal of the source sacrificial layers via the gate line cut trenches. The removal of the source sacrificial layers forms source connection openings 159. It is noted that, due to the protection of the shield structure 130, the source sacrificial layers in the region 140 have not been removed. Further, because the dummy channel structures 110B and 110C are in the region 140, the ends of the dummy channel structures 110B and 110C are intact. The first stack of layers in the region 140 remains in the semiconductor device after the removal of the source sacrificial layers, and can support the neighboring regions, and reduce the risk of collapse.

It is noted that some of the layers that form the channel structures, such as the blocking insulating layer, the charge storage layer, the tunneling insulating layer that have oxide-nitride-oxide (ONO) structure, can be removed, and the semiconductor layer at the bottom of the channel structures is exposed to the source connection openings.

It is also noted that, in an example, during the removal of the source sacrificial layers, the sidewalls of the gate line cut trenches can be covered with a protection layer to avoid etching of the sacrificial gate layers.

Referring back to FIG. 3, at S370, sidewall SEG is performed to grow epitaxial layer and fill the source connection openings with source connection material, such as doped silicon, doped polysilicon, doped amorphous and the like. The source connection material is then in contact with the semiconductor layer (for forming channel of the memory cells and select transistors) at the bottom of the channel structures and forms source connections.

At S380, further processes can be performed. In an example, real gates are formed. In some embodiments, using the gate line cut trenches, the gate sacrificial layers can be replaced by the gate layers. In an example, etchants to the gate sacrificial layers are applied via the gate line cut trenches to remove the gate sacrificial layers. In an example, the gate sacrificial layers are made of silicon nitride, and the hot sulfuric acid ($H_2SO_4$) is applied via the gate line cut trenches to remove the gate sacrificial layers. Further, via the gate line cut trenches, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Further, in some examples, the fabrication process continues to, for example, fill the gate line cut trenches with spacer material (e.g., silicon oxide) and common source material (e.g., tungsten) to form the gate line cut structures. Further, contacts structures can be formed and metal traces can be formed.

Figure 5:
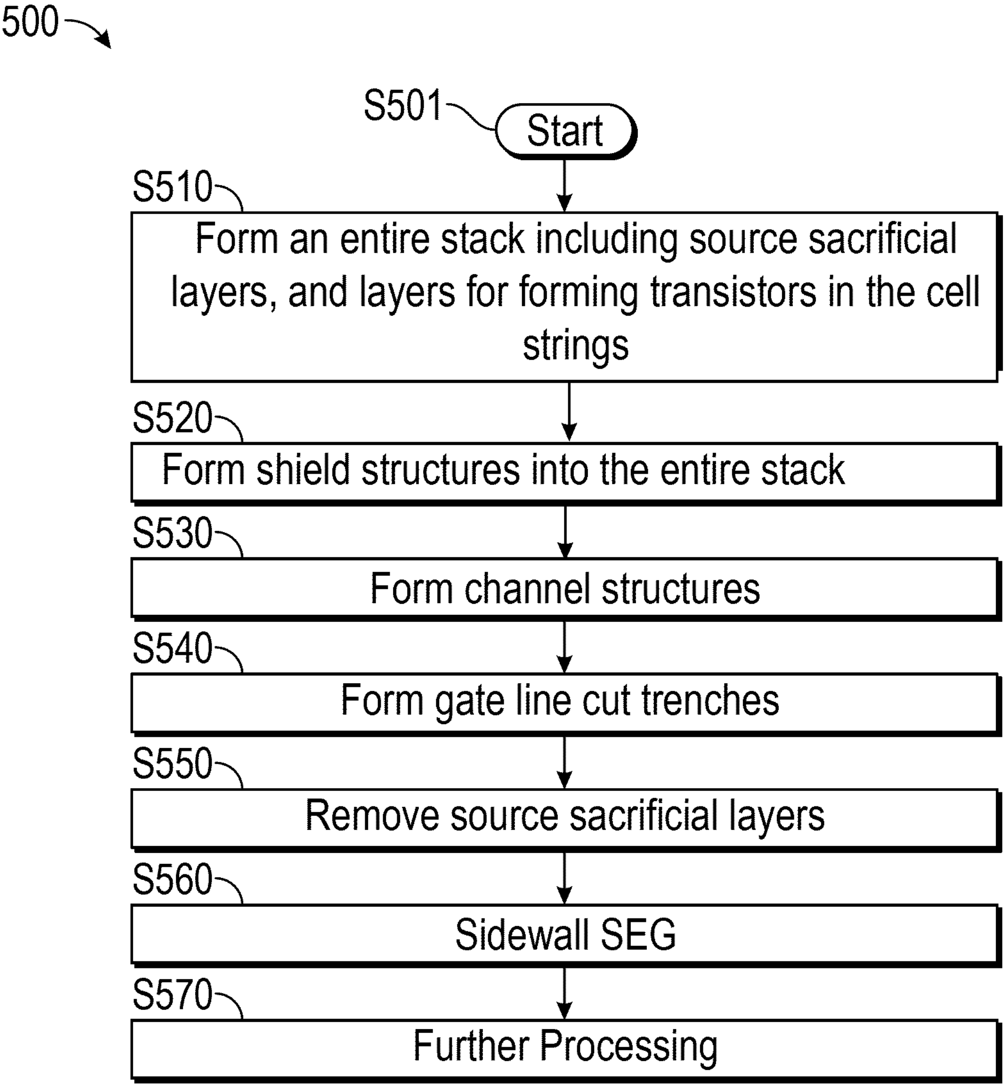
FIG. 5 shows a flow chart outlining a process example according to some embodiments of the disclosure.

FIG. 5 shows a flow chart outlining a process example for fabricating a semiconductor device, such as the semiconductor device 100-D according to some embodiments of the disclosure. The process starts at S501 and proceeds to S510.

At S510, an entire stack of initial layers is formed on a substrate. The entire stack of initial layers includes source sacrificial layers and layers for forming transistors in the cell strings, such as sacrificial gate layers and insulating layers that are used to form transistors, such as dummy bottom select transistors, bottom select transistors, memory cell transistors, top select transistors and the like. Additionally, in some examples, buffer layers can be formed on the first stack of initial layers.

At S520, shield structures 130-D are formed in the entire stack of initial layers. In some examples, the shield mask is used to transfer the patterns of the shield structures into the entire stack of initial layers.

In an example, a lithography process and an etch process can be used to transfer the patterns of the shield structures from the shield mask to the entire stack of initial layers, and openings corresponding to the shield patterns in the shield mask can be generated in the entire stack of initial layers Further, in an example, shield material is filled into the openings to form the shield structures 130-D. In an example, the openings are overfilled with the shield material and then a chemical mechanical polishing (CMP) process is used to remove the overburden shield material. In an example, the buffer layers can be removed after the CMP process.

At S530, channel structures are formed in the entire stack of initial layers.

In some embodiments, staircase is formed in the staircase region and suitably planarization process is performed to obtain a relatively flat surface. Then, photo lithography technology is used to define patterns of channel holes and dummy channel holes in photoresist and/or hard mask layers, and etch technology is used to transfer the patterns into the entire stack of initial layers. Thus, channel holes are formed in the core region and the dummy channel holes are formed in the staircase region. One or more dummy channel holes are in the region that is enclosed by a shield structure.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures. In an example, the blocking insulating layer is formed on the sidewall of channel holes and the dummy channel holes. Then, a charge storage layer, a tunneling insulating layer, a semiconductor layer, and an insulating layer are sequentially stacked from the sidewall. In some embodiments, the dummy channel structures are formed by support materials. Thus, one or more dummy channel structures are in the region that is enclosed by the shield structure.

At S540, gate line cut trenches (also referred to as gate line slits in some examples) are formed. In some embodiments, the gate line cut trenches are etched to a source sacrificial layer. In an example, the source sacrificial layers includes a silicon oxide layer, a silicon nitride layer, a polysilicon layer, a silicon nitride layer and a silicon oxide layer from bottom. The polysilicon layer is sandwiched by two silicon nitride layers and then two silicon oxide layers. Then, the etching of the gate line cut trenches stops at the polysilicon layer.

At S550, source sacrificial layers are removed via the gate line cut trenches. The removal of the source sacrificial layers forms source connection openings. In an example, when the polysilicon layer is sandwiched by two silicon nitride layers and then two silicon oxide layers, a first etchant is applied to remove the polysilicon layer. The silicon nitride layers can protect the other layers from damage due to the first etchant. Then, a second etchant is applied to remove the two silicon nitride layers. The silicon oxide layers can protect the other layers from damage due to the second etchant. Then, a third etchant is applied to remove the two silicon oxide layers.

The removal of the source sacrificial layers forms source connection openings. It is noted that, due to the protection of the shield structure, the source sacrificial layers in the region that enclosed by the shield structure have not been removed. Further, the one or more dummy channel structures that are in the region enclosed by the shield structure are also protected by the shield structure, and the ends of the dummy channel structures are intact. It is noted that the entire stack of initial layers in the region that is enclosed by the shield structures remains in the semiconductor device after the process of removal of the source sacrificial layers that are not protected by the shield structures, and can support the neighboring regions, and reduce the risk of collapse.

It is noted that some of the layers that form the channel structures, such as the blocking insulating layer, the charge storage layer, the tunneling insulating layer that have oxide-nitride-oxide (ONO) structure, can be removed, and the semiconductor layer at the bottom of the channel structures is exposed to the source connection openings.

It is also noted that, in an example, during the removal of the source sacrificial layers, the sidewalls of the gate line cut trenches can be covered with a protection layer to avoid etching of the sacrificial gate layers.

At S560, sidewall SEG is performed to grow epitaxial layer and fill the source connection openings with source connection material, such as doped silicon, doped polysilicon, doped amorphous and the like. The source connection material is then in contact with the semiconductor layer (for forming channel of the memory cells and select transistors) at the bottom of the channel structures and forms source connections.

At S570, further processes can be performed. In an example, real gates are formed. In some embodiments, using the gate line cut trenches, the gate sacrificial layers can be replaced by the gate layers. In an example, etchants to the gate sacrificial layers are applied via the gate line cut trenches to remove the gate sacrificial layers. In an example, the gate sacrificial layers are made of silicon nitride, and the hot sulfuric acid ($H_2SO_4$) is applied via the gate line cut trenches to remove the gate sacrificial layers. Further, via the gate line cut trenches, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Further, in some examples, the fabrication process continues to, for example, fill the gate line cut trenches with spacer material (e.g., silicon oxide) and common source material (e.g., tungsten) to form the gate line cut structures. Further, contacts structures can be formed and metal traces can be formed.

It is noted that, step sequence in FIG. 5 example can be changed. In an example, the shield structures are formed after the formation of the channel structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:

stacking first layers including one or more sacrificial layers on a substrate;

forming a shield structure that encloses a portion of the sacrificial layers;

forming channel structures that extending through the first layers in a first direction perpendicular to the substrate, the channel structure including a channel layer;

forming a gate line cut structure extending through the first layers in the first direction; and replacing, via the gate line cut structure, the sacrificial layers with at least a source connection layer, the portion of the sacrificial layers enclosed by the shield structure remaining on the substrate;

further comprising:

etching, via the gate line cut structure, the one or more sacrificial layers that forms a source connection opening; and etching, via the gate line cut structure, an insulating layer of the channel structure to expose the channel layer;

wherein the first layers include gate sacrificial layers and insulating layer, and the method further comprises: replacing, via the gate line cut structure, the gate sacrificial layers with gate layers.

2. The method of claim 1, further comprising:

defining the shield structure based on a mask.

3. The method of claim 1, further comprising:

etching the first layers to form an opening for the shield structure; and filling the opening with a shield material.

4. The method of claim 3, wherein filling the opening with the shield material further comprises:

overfilling the shield material in the opening; and polishing to remove an overburden portion of the shield material.

5. The method of claim 1, wherein filling the source connection opening with source connection layers.

6. The method of claim 1, further comprising:

stacking, after the formation of shield structure and on the first layers, second layers including gate sacrificial layers and insulating layers.

7. The method of claim 1, wherein the shield structure includes an enclosed portion that encloses one or more dummy channel structures in a staircase region.

8. The method of claim 1, wherein the shield structure includes a non-enclosed portion in a core region.

9. A method for forming a semiconductor device, comprising:

stacking layers including one or more sacrificial layers, sacrificial gate layers and insulating layers on a substrate, the sacrificial layers and the insulating layers being stacked alternatively;

forming a shield structure that encloses a portion of the stacked layers that include the sacrificial layers, the sacrificial gate layers and insulating layers;

forming channel structures that extending through the stacked layers in a first direction perpendicular to the substrate, the channel structure including a channel layer;

forming a gate line cut structure extending through a sacrificial layer in the stacked layers; and replacing, via the gate line cut structure, the sacrificial layers with at least a source connection layer, the sacrificial layers in the enclosed portion by the shield structure remaining on the substrate-;

further comprising:

etching, via the gate line cut structure, the one or more sacrificial layers that forms a source connection opening; and etching, via the gate line cut structure, an insulating layer of the channel structure to expose the channel layer; and the method further comprises:

replacing, via the gate line cut structure, the gate sacrificial layers with gate layers.

* * * * *